(12) United States Patent
Ma et al.

(10) Patent No.: US 10,416,568 B2
(45) Date of Patent: Sep. 17, 2019

(54) LIGHT INTENSITY MODULATION METHOD

(71) Applicant: SHANGHAI MICRO ELECTRONICS EQUIPMENT (GROUP) CO., LTD., Shanghai (CN)

(72) Inventors: Pengchuan Ma, Shanghai (CN); Yiqiang Tian, Shanghai (CN)

(73) Assignee: Shanghai Micro Electronics Equipment (Group) Co., Ltd., Shanghai (CN)

(*) Notice: Subject to any disclaimer, the term of this patent is extended or adjusted under 35 U.S.C. 154(b) by 0 days.

(21) Appl. No.: 16/090,032

(22) PCT Filed: Mar. 30, 2017

(86) PCT No.: PCT/CN2017/078717
§ 371 (c)(1),
(2) Date: Sep. 28, 2018

(87) PCT Pub. No.: WO2017/167211
PCT Pub. Date: Oct. 5, 2017

(65) Prior Publication Data
US 2019/0113850 A1 Apr. 18, 2019

(30) Foreign Application Priority Data
Mar. 31, 2016 (CN) .......................... 2016 1 0200470

(51) Int. Cl.
G03F 7/20 (2006.01)
(52) U.S. Cl.
CPC ............ G03F 7/70191 (2013.01); G03F 7/20 (2013.01); G03F 7/70075 (2013.01);
(Continued)

(58) Field of Classification Search
CPC .................................................. G03F 7/70083
See application file for complete search history.

(56) References Cited

U.S. PATENT DOCUMENTS

2013/0308131 A1  11/2013  Barak

FOREIGN PATENT DOCUMENTS

CN  101311833 A  11/2008
CN  102109676 A  6/2011
(Continued)

Primary Examiner — Michelle M Iacoletti
(74) Attorney, Agent, or Firm — Muncy, Geissler, Olds & Lowe, P.C.

(57) ABSTRACT

A light intensity modulation method implemented by using a mask (101) includes the steps of: 1) based on a circle of confusion (CoC) function of an illumination system (102), an initial light intensity distribution of an illumination field of view (FOV) and a target light intensity distribution of the illumination FOV, calculating a transmittance distribution of the mask (101) used to modulate the initial light intensity distribution into the target light intensity distribution; 2) meshing the mask (101) according to a desired accuracy of the target light intensity distribution and determining a distribution of opaque dots in each of cells resulting from the meshing based on the transmittance distribution of the mask (101) and a desired accuracy of the transmittance distribution; and 3) fabricating the mask (101) based on the determined distribution of the opaque dots and then deploying the mask (101) in the illumination system. Advantages including a high modulation accuracy, an applicability to wide FOV size, light intensity and wavelength ranges and compatibility with established manufacturing processes can be attained.

6 Claims, 3 Drawing Sheets

(52) U.S. Cl.
CPC ...... *G03F 7/70083* (2013.01); *G03F 7/70091* (2013.01); *G03F 7/70125* (2013.01); *G03F 7/70141* (2013.01)

(56) References Cited

FOREIGN PATENT DOCUMENTS

| | | | |
|---|---|---|---|
| CN | 102169295 | A | 8/2011 |
| CN | 102866589 | A | 1/2013 |
| CN | 102998896 | A | 3/2013 |
| CN | 103376644 | A | 10/2013 |
| CN | 103926802 | A | 7/2014 |
| CN | 105425411 | A | 3/2016 |
| EP | 1624338 | A3 | 4/2006 |
| JP | S61240202 | A | 10/1986 |
| JP | 200647612 | A | 2/2006 |

LIGHT INTENSITY MODULATION METHOD

TECHNICAL FIELD

The present invention relates to a light intensity modulation method, used in an illumination system, for modulating the distribution of light intensity in an illumination field of view (FOV).

BACKGROUND

Photolithography is a technique for exposing and imaging a mask pattern onto a substrate, which plays an important role in the fabrication of semiconductor devices. During the fabrication of a semiconductor device, it is necessary to provide an imaging system in the photolithography tool with an illumination field of view (FOV) that has a desired size and a light intensity uniformity. At present, such desired light intensity uniformity is realized by an optical system with a light homogenizer such as an optical integrator rod or a microlens adopted in the design of the imaging system. This optical system allows the formation of a uniform illumination FOV on an objective surface.

During the design of an illumination system, the requirements for a desired light intensity distribution in the illumination FOV must be satisfied. However, errors may be introduced in the subsequent processes of lens processing, coating and mechanical installation due to some uncontrollable factors. As a result, the actual final light intensity distribution may more or less deviate from what it is purported to be. In this case, it will be necessary to take some effective measures to modulate the actual light intensity distribution in order to compensate for the deviation and increase accuracy of the illumination FOV.

In addition, after the illumination system is completed, it is also needed to modulate the illumination FOV in order to make it suitable for use in more applications. The modulation of the illumination FOV is essentially that of its light intensity distribution, for example, the modulation of the trend, uniformity or the like. Moreover, with the continuous development of the photolithography technology, there is an increasing demand for post-manufacturing adjustments in light intensity distribution. Therefore, there is a need for a reliable, accurate method for adjusting the light intensity distribution of an illumination FOV such that the illumination FOV of the illumination system may have a wider range of applications.

In the prior art, there are two available solutions for modulating a light intensity distribution. FIG. 1 shows one of the solutions, which enables unidirectional light transmission modulation by placing an assembly of individual shading plates 10 on the optical path of an illumination system. The shading plates 10 are each provided with opaque spots 11. The opaque spots 11 on the shading plates 10 can be combined and superimposed in different manners to adjust the range and transmittance in light intensity modulation. This technique, however, has a number of deficiencies such as only allowing the modulation of transmittance, a narrow adjustable FOV size, a low adjustment accuracy and a high structural complexity. The other one of the conventional solutions employs a filter constructed by coating (e.g., plating) films with different transmittances on different regions of a transparent substrate. In this way, the regions coated with the films also have different transmittances and enable light intensity modulation. This technique also suffers from several disadvantages such as a low accuracy, different film-coating designs required for intensity modulation of light having different wavelengths, a high cost and a high manufacturing complexity. Further, both of the above two conventional techniques are applicable to a limited range of wavelengths.

In summary, the conventional techniques are associated with drawbacks such as a low modulation accuracy, a small FOV size of modulation, a narrow light intensity modulation range, a small applicable wavelength range and a high manufacturing complexity.

SUMMARY OF THE INVENTION

The problem to be solved by the present invention is to provide a light intensity modulation method that is accurate, applicable to wide FOV size, light intensity and wavelength ranges and compatible with established manufacturing processes.

In order to achieve the above purpose, the present invention adopts the following technical solutions:

a light intensity modulation method implemented by using a mask, comprising the steps of:

1) calculating a transmittance distribution of the mask for modulating an initial light intensity distribution into a target light intensity distribution based on a circle of confusion (CoC) function of an illumination system, the initial light intensity distribution of an illumination field of view (FOV) and the target light intensity distribution of the illumination FOV;

2) meshing the mask according to a desired accuracy of the target light intensity distribution and determining a distribution of opaque dots in each of the cells resulting from the meshing based on the transmittance distribution of the mask and a desired accuracy of the transmittance distribution; and 3) fabricating the mask based on the determined distribution of the opaque dots and then deploying the mask in the illumination system.

Preferably, in step 1), the transmittance distribution of the mask is derived by a deconvolution according to the following formula:

$$(K * N) \times \mathrm{Fun} = M,$$

where,
K denotes the initial light intensity distribution;
M denotes the target light intensity distribution;
N denotes the transmittance distribution of the mask;
Fun denotes the CoC function;
\* denotes a multiplication operation; and
× denotes a convolution operation,
where, the CoC function is:

$$\mathrm{Fun}(x, y) = \frac{e^{\left(-\frac{x^2+y^2}{2\sigma^2}\right)}}{\sqrt{2\pi} \cdot \sigma},$$

$$3\sigma = R = L * \tan(\theta),$$

wherein,
R denotes a radius of an optical spot formed in the illumination FOV by a corresponding one of the opaque dots on the mask;
x and y denote coordinates of a certain point in the illumination FOV;
L denotes a distance between the mask and the illumination FOV; and θ denotes an angle of divergence of the illumination system.

Preferably, meshing the mask according to the desired accuracy of the target light intensity distribution in step 2) comprises: initially meshing the mask; and interpolating the resulting cells so that a greatest value, after interpolation, out of light intensity gradients between adjacent cells is smaller than the desired accuracy of the target light intensity distribution.

Preferably, determining the distribution of the opaque dots in each of the meshed based on the transmittance distribution of the mask and the desired accuracy of the transmittance distribution in step 2) comprises: calculating an area of the opaque dots based on a criterion that a ratio of the area of the opaque dots to an area of a corresponding one of the cell is not greater than the desired accuracy of the target light intensity distribution; and determining, by fitting, a number of the opaque dots and a pitch of opaque dots in a corresponding one of the cells based on the transmittance distribution of the mask and on the area of the opaque dots.

Preferably, the opaque dots are implemented as chrome dots.

Preferably, in step 3, the mask is fabricated using a mask-fabrication process.

Preferably, the mask is formed of fused silica.

Compared to the prior art, according to the present invention, a desired transmittance distribution for the mask is calculated based on an actual light intensity distribution of the illumination FOV and a target light intensity distribution of the illumination FOV so as to achieve a light intensity distribution modulation; based on an desired accuracy of a target light intensity distribution, an accuracy value of the transmittance distribution of the mask is calculated, and hence an opaque dot distribution for the mask is obtained; a mask fabricated by a mask-fabrication process has advantages of a high modulation accuracy, applicability to wide FOV size, light intensity and wavelength ranges and compatibility with established manufacturing processes can be attained.

In these figures: 10, denotes a shading plate; 11, an opaque spot; 101, a mask; 102, an illumination FOV; A, a chrome dot; A', a circle of confusion spot; B, a chrome spot; B', a circle of confusion dot; L, a distance between the mask and the illumination FOV; and θ, an angle of divergence of the illumination system.

DETAILED DESCRIPTION

The present invention will be described in greater detail with reference to the accompanying drawings.

Figure 1:
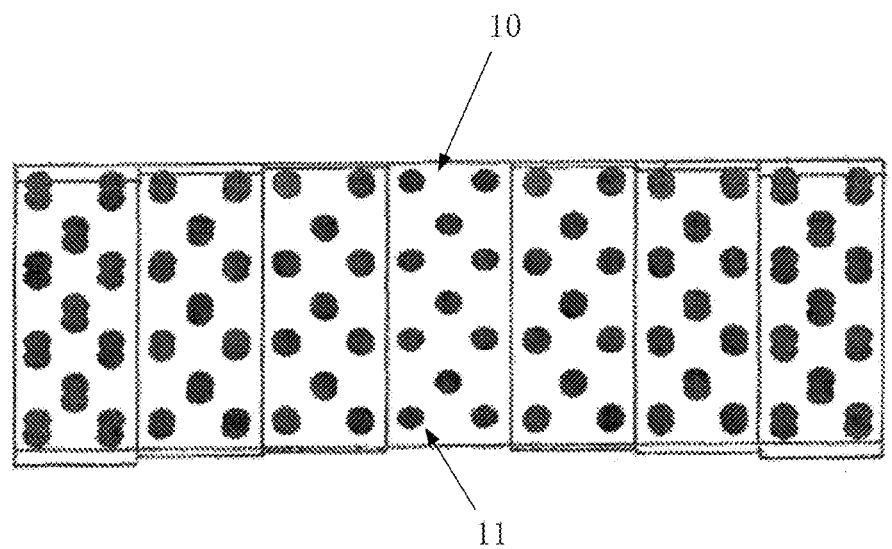
FIG. 1 shows a top view of conventional shading plates.
Figure 2:
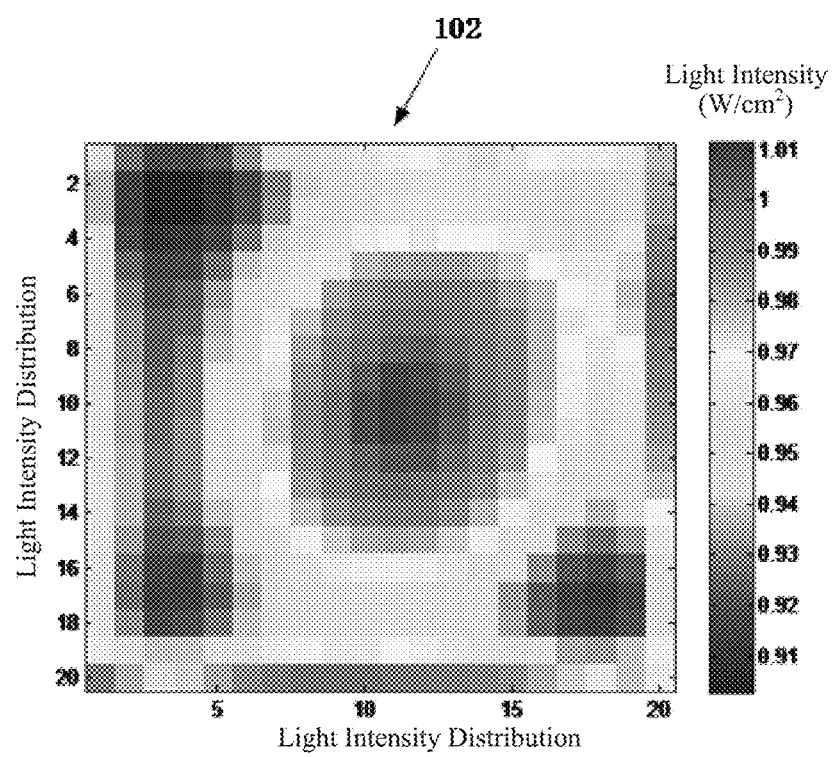
FIG. 2 schematically illustrates an actual light intensity distribution in an illumination FOV according to an embodiment of the present invention.

FIG. 2 shows an actual light intensity distribution in an illumination FOV of a conventional illumination system. As shown, the light intensity distribution is inferior in terms of uniformity and accuracy. The present invention provides a method for generating such a light intensity distribution by modulation.

Specifically, the light intensity modulation method of present invention includes the following steps.

In Step 1, a desired transmittance distribution for a mask 101 is calculated based on a circle of confusion (CoC) function of the illumination system, an initial light intensity distribution of the illumination FOV 102 and a target light intensity distribution. The mask 101 may be formed of fused silica, and preferably of a very low thermal expansion coefficient fused silica in compliance with standards of SEMI (Semiconductor Equipment and Materials International) P1-1101.

Figure 3:
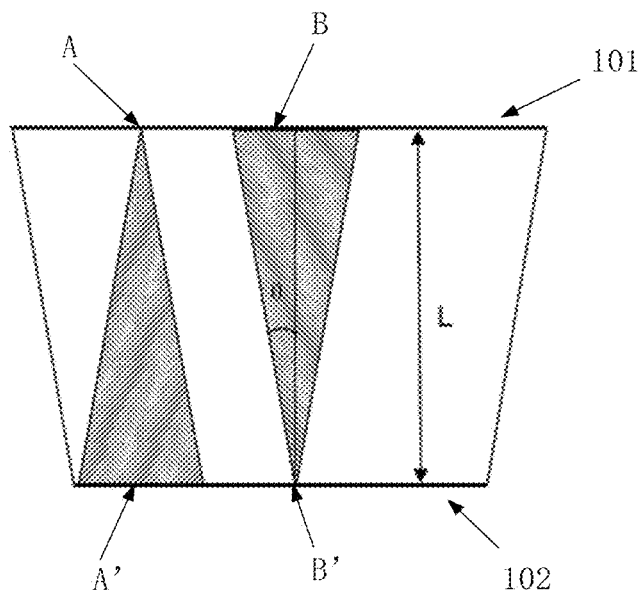
FIG. 3 schematically illustrates principles of a light intensity modulation method according to an embodiment of the present invention.
Figure 4:
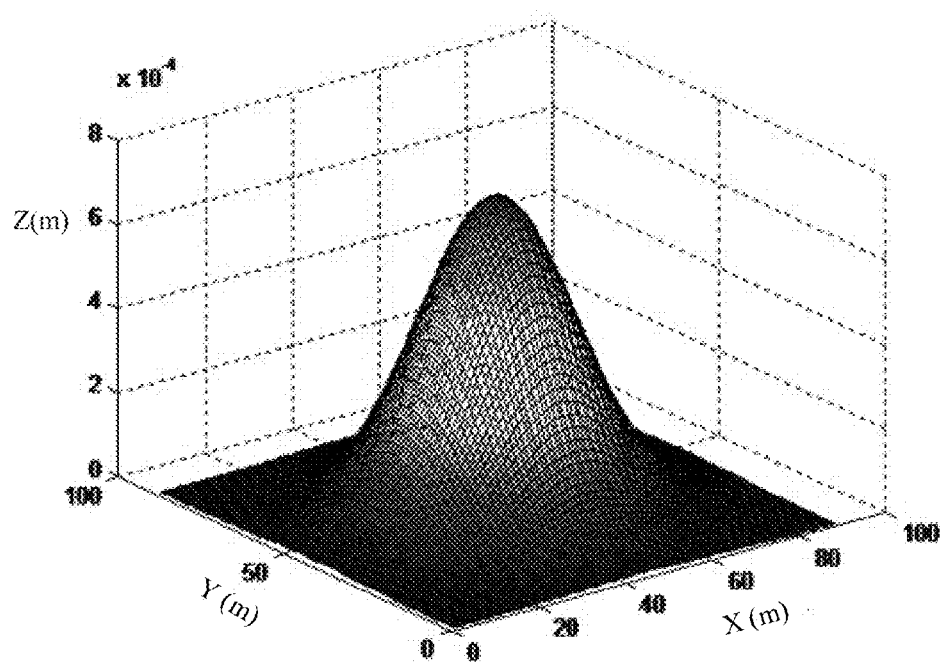
FIG. 4 shows a simulation of a circle of confusion (CoC) function according to an embodiment of the present invention.

Referring to FIG. 3, the light intensity modulation method of the present invention will be described below with a chrome dot A and a chrome spot B on the mask 101 as an example. In FIG. 3, the chrome dot A and chrome spot B are both circular.

Light emanated from the illumination system is incident on a top surface of the mask 101 and transmits through the mask 101, forming the illumination FOV 102 under the mask. Since the light from the illumination system travels in the shape of a cone, after transmitting through the chrome dot A, it diverges on the way due to the CoC effect and forms a circle of confusion spot A' with a certain diameter in the illumination FOV 102. On the other hand, after transmitting through the chrome spot B, the light converges on the way due to the CoC effect and forms a circle of confusion spot B' in the illumination FOV 102. Therefore, the transmittance distribution of the mask 101 can be derived from a deconvolution based on an angle of divergence θ of the illumination system and the distance L between the mask 101 and the illumination FOV 102 according to:

$$(K*N) \times \text{Fun} = M,$$

where,

K denotes the initial light intensity distribution;

M denotes the target light intensity distribution;

N denotes the transmittance distribution of the mask 101;

Fun denotes the CoC function;

* denotes a multiplication operation, and hence, K*N denotes a product of a value in the initial light intensity distribution K and a corresponding value in the transmittance distribution N of the reticle 101; and × denotes a convolution operation.

Specifically, the CoC function is:

$$\text{Fun}(x, y) = \frac{e^{\left(-\frac{x^2+y^2}{2\sigma^2}\right)}}{\sqrt{2\pi} \cdot \sigma},$$

$$3\sigma = R = L*\tan(\theta),$$

where,

R denotes the radius of an optical spot formed in the illumination FOV 102 by a chrome dot on the mask 101;

x and y denote the coordinates of a certain point in a coordinate system originated at an arbitrary point in the illumination FOV 102;

L denotes the distance between the mask 101 and the illumination FOV 102; and θ denotes the angle of divergence of the illumination system.

In the above formula, K, the initial light intensity distribution of the illumination FOV 102, can be measured in the optical path of the illumination system; M, the target light intensity distribution of the illumination FOV 102, is the light intensity distribution sought to be achieved; and N, the transmittance distribution of the mask 101 for modulating the initial light intensity distribution into the target light intensity distribution, is the only unknown quantity in the formula. Thus, the transmittance distribution of the mask 101 can be calculated as the unique solution of the above formula.

With this technique, based on a comparative analysis of the initial and target light intensity distributions of the illumination FOV 102, the desired transmittance distribution of the mask 101 can be calculated using the CoC function. In this way, the modulation of the initial light intensity distribution can be accomplished by adjusting the light transmission of the mask in accordance with the CoC principle through changing the radius or number of the chrome dots. As a result, the accuracy in the modulation of the light intensity distribution can be improved and the modulated light intensity distribution is more uniform and more accurate. This results from greater granularity of distinction between the light-transmitting and opaque features, and a modulation accuracy of up to 0.2% has been achieved in practice, with an expanded light intensity modulation range. Moreover, since the modulation is not subjected to any strict constraint on light wavelength, the technique can be applied to light of a wavelength ranging from 1 μm to 193 nm. Therefore, it can be used in more applications. Further, the use of a mask 101 structure allows the modulation technique to be applied to greater FOV sizes. In practice, light intensity modulation for an illumination FOV size of up to 150 mm×150 mm has been achieved.

In step 2: the mask 101 is meshed based on desired accuracy of the target light intensity distribution. Specifically, the mask 101 is first initially meshed, and the resulting cells are so interpolated that the greatest value out of light intensity gradients between adjacent cells is smaller than the desired accuracy of the target light intensity distribution. After that, a distribution of opaque dots (i.e., chrome dots) in each of the cells is determined based on the transmittance distribution of the mask 101 and desired accuracy for the transmittance distribution. Specifically, for each of the cells, the area of opaque dots (i.e., the total area of all opaque dots in the cell) is calculated based on a criterion that a ratio of the area of opaque dots to the area of a corresponding cell is not greater than the desired accuracy of the target light intensity distribution, and the number of opaque dots and a pitch of adjacent opaque dots are determined by fitting based on the transmittance distribution of the mask 101 and on the area of opaque dots. In this embodiment, opaque dots in each of the cells have the same radius and hence the same area.

With this technique, the accuracy of the transmittance distribution of the mask 101 is first determined based on the desired accuracy of the target light intensity distribution, and another calculation is then performed to determine a distribution of opaque dots on the mask 101, i.e., the number of meshes in the area in which the light intensity distribution is to be modulated and the area of opaque dots in each of the meshes. In this way, the light intensity distribution is ensured to be modulated with higher accuracy, imparting a higher accuracy and a higher reliability to the light intensity modulation method of the invention and allowing this method to achieve a high-accuracy, a high-uniformity modulation of the light intensity distribution in the illumination FOV 102.

Preferably, the opaque dots are implemented as chrome dots. The distribution of the opaque dots on the mask 101 includes the number of chrome dots in each of the cells that corresponds to the transmittance.

The metal chromium is opaque, and the existing chrome plating processes can fabricate chrome dots with a minimum radius of 5 μm. Therefore, opaque dots can be made on mask 101 to result in a desired transmittance of the mask. In this way, the accuracy of the transmittance distribution, and hence the accuracy in the light intensity distribution modulation achieved by the mask 101 can be improved. As a result, when modulated by the light intensity modulation method of the present invention, the light intensity distribution in the illumination FOV 102 will have enhanced uniformity and accuracy.

Figure 5:
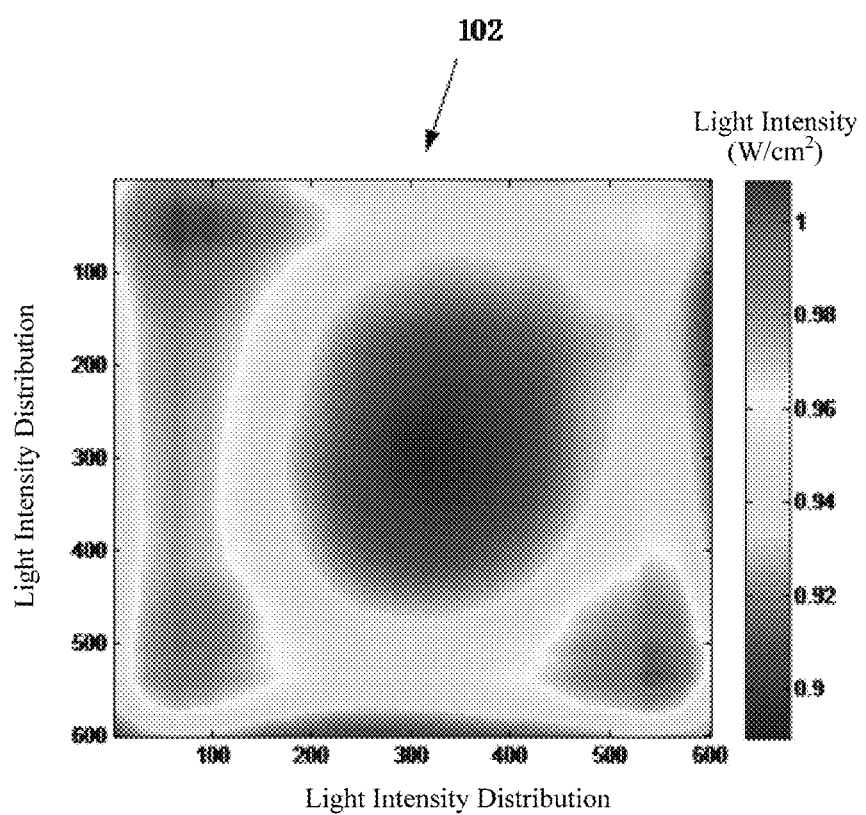
FIG. 5 schematically illustrates a light intensity distribution modulated using a mask in accordance with an embodiment of the present invention.

In step 3, the distribution of the opaque dots determined in step 2 is drawn using drawing software such as AutoCAD and the mask 101 is processed based on the drawing using a mask-fabrication process. After that, the mask 101 is deployed in the illumination system. FIG. 5 shows a light intensity distribution modulated by using the mask 101. As can be seen from FIG. 5, the modulation performed by the light intensity modulation method of the present invention significantly improves the uniformity and modulation accuracy of the light intensity distribution in the illumination FOV 102.

The conventional mask-fabrication process is an established technique and is improved in terms of maturity and efficiency, compared to the shading plates used in the first conventional solution and the film coating technique used in the second conventional solution. Therefore, the light intensity modulation method of the present invention has the advantage of easier implementation.

In summary, according to the present invention, a desired transmittance distribution for the mask 101 is calculated based on an initial light intensity distribution of the illumination FOV 102 and a target light intensity distribution of the illumination FOV 102 so as to achieve the light intensity distribution modulation. An accuracy value of the transmittance distribution of the mask 101, and hence an opaque dot distribution for the mask 101, is derived from desired accuracy of the target light intensity distribution. The production of the mask 101 using a mask-fabrication process has advantages of a high modulation accuracy, applicability to wide FOV size, light intensity and wavelength ranges and compatibility with established manufacturing processes.

What is claimed is:

1. A light intensity modulation method implemented by using a mask, comprising the steps of:
   1) calculating a transmittance distribution of the mask for modulating an initial light intensity distribution into a target light intensity distribution, based on a circle of confusion (CoC) function of an illumination system, the initial light intensity distribution of an illumination field of view (FOV) and the target light intensity distribution of the illumination FOV;
   2) meshing the mask according to a desired accuracy of the target light intensity distribution and determining a distribution of opaque dots in each of cells resulting from the meshing based on the transmittance distribution of the mask and a desired accuracy of the transmittance distribution; and 3) fabricating the mask based on the determined distribution of the opaque dots, and then deploying the mask in the illumination system.

2. The light intensity modulation method according to claim 1, wherein in step 1), the transmittance distribution of the mask is derived by a deconvolution according to the following formula:

$$(K*N) \times \text{Fun} = M,$$

where,
K denotes the initial light intensity distribution;
M denotes the target light intensity distribution;
N denotes the transmittance distribution of the mask;
Fun denotes the CoC function;
* denotes a multiplication operation; and
× denotes a convolution operation,
and wherein, the CoC function is:

$$\text{Fun}(x, y) = \frac{e^{\left(-\frac{x^2+y^2}{2\sigma^2}\right)}}{\sqrt{2\pi} \cdot \sigma},$$

$$3\sigma = R = L * \tan(\theta),$$

where,
R denotes a radius of an optical spot formed in the illumination FOV by a corresponding one of the opaque dots on the mask;
x and y denote coordinates of a certain point in the illumination FOV;
L denotes a distance between the mask and the illumination FOV; and
θ denotes an angle of divergence of the illumination system.

3. The light intensity modulation method according to claim 1, wherein meshing the mask according to the desired accuracy of the target light intensity distribution in step 2) comprises: initially meshing the mask; and interpolating the resulting cells so that a greatest value, after interpolation, out of light intensity gradients between adjacent cells is smaller than the desired accuracy of the target light intensity distribution.

4. The light intensity modulation method according to claim 1, wherein determining the distribution of the opaque dots in each of the cells based on the transmittance distribution of the mask and the desired accuracy of the transmittance distribution in step 2) comprises: calculating an area of opaque dots based on a criterion that a ratio of the area of opaque dots to an area of a corresponding one of the cells is not greater than the desired accuracy of the target light intensity distribution; and determining, by fitting, a number of the opaque dots and a pitch of the opaque dots in a corresponding one of the cells based on the transmittance distribution of the mask and on the area of the opaque dots.

5. The light intensity modulation method according to claim 1, wherein the opaque dots are implemented as chrome dots.

6. The light intensity modulation method according to claim 1, wherein the mask is formed of fused silica.

* * * * *